US008748819B2

(12) United States Patent
Benner (10) Patent No.: US 8,748,819 B2
(45) Date of Patent: Jun. 10, 2014

(54) TRANSMISSION ELECTRON MICROSCOPY SYSTEM AND METHOD OF OPERATING A TRANSMISSION ELECTRON MICROSCOPY SYSTEM

(71) Applicant: Carl Zeiss Microscopy GmbH, Jena (DE)

(72) Inventor: Gerd Benner, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/864,600

(22) Filed: Apr. 17, 2013

(65) Prior Publication Data

US 2013/0292566 A1    Nov. 7, 2013

(30) Foreign Application Priority Data

Apr. 19, 2012 (DE) .......................... 10 2012 007 868

(51) Int. Cl.
*H01J 37/26* (2006.01)
*H01J 37/063* (2006.01)
*H01J 37/12* (2006.01)

(52) U.S. Cl.
USPC . 250/311; 250/310; 250/396 R; 250/396 ML; 250/397; 250/398

(58) Field of Classification Search
USPC ....... 250/311, 310, 396 R, 396 ML, 397, 398
See application file for complete search history.

(56) References Cited

U.S. PATENT DOCUMENTS 3,857,034 A    12/1974  Hoppe
5,453,617 A *  9/1995  Tsuneta et al. ............. 250/311
6,437,353 B1 * 8/2002  Benner ...................... 250/492.23
6,822,233 B2 * 11/2004 Nakamura et al. .......... 250/311
6,992,286 B2 * 1/2006  Yaguchi et al. ............. 250/306
7,285,776 B2   10/2007 Nakamura et al.
7,372,029 B2 * 5/2008  Tsuneta et al. ............. 250/311
8,344,320 B2 * 1/2013  Terada et al. ............... 250/305

(Continued)

FOREIGN PATENT DOCUMENTS

DE           2 043 749 A1     3/1972
DE      10 2011 012 736 A1    9/2011

OTHER PUBLICATIONS

E. Okunishi et al., "Visualization of Light Elements at Ultrahigh Resolution by STEM Annular Bright Field Microscopy", Microscopy and Microanalysis, vol. 15, Suppl. 2, 2009, pp. 164-165.

(Continued)

*Primary Examiner* — David A Vanore
(74) *Attorney, Agent, or Firm* — Bruce D Riter (57) ABSTRACT

A transmission electron microscopy system has an illumination system and an objective lens system. A first projection system images the diffraction plane of the objective lens system into a first intermediate diffraction plane. A second projection system images the first intermediate diffraction plane into a second intermediate diffraction plane. A first aperture located in the first intermediate diffraction plane has a central opening of a first radius. A bright field detector located in the second intermediate diffraction plane has a detection surface defined by an inner edge of a second radius. The first radius and the second radius define a maximum angle and a minimum angle, respectively, relative to the optical axis of directions of bright field electrons traversing the sample plane and detectable by the bright field detector.

23 Claims, 3 Drawing Sheets

(56) References Cited

U.S. PATENT DOCUMENTS

| | | | |
|---|---|---|---|
| 8,471,203 B2* | 6/2013 | Benner et al. | 250/311 |
| 2007/0228277 A1* | 10/2007 | Tsuneta et al. | 250/311 |
| 2011/0031395 A1* | 2/2011 | Harada et al. | 250/307 |
| 2011/0192976 A1* | 8/2011 | Own et al. | 250/311 |
| 2011/0210249 A1* | 9/2011 | Benner | 250/310 |
| 2011/0233403 A1* | 9/2011 | Own et al. | 250/311 |
| 2012/0012747 A1* | 1/2012 | Lazar et al. | 250/307 |
| 2012/0025094 A1* | 2/2012 | Benner et al. | 250/396 R |
| 2013/0043386 A1* | 2/2013 | Yamazaki | 250/307 |
| 2013/0146764 A1* | 6/2013 | Own et al. | 250/307 |
| 2013/0206987 A1* | 8/2013 | Omoto | 250/311 |
| 2013/0292566 A1* | 11/2013 | Benner | 250/307 |

OTHER PUBLICATIONS

Office Action in German patent application No. 10 2012 007 868.4 dated Dec. 20, 2012, with English-language translation.

* cited by examiner

TRANSMISSION ELECTRON MICROSCOPY SYSTEM AND METHOD OF OPERATING A TRANSMISSION ELECTRON MICROSCOPY SYSTEM

CROSS-REFERENCES TO RELATED APPLICATIONS

This application claims priority of Patent Application No. 10 2012 007 868.4, filed Apr. 19, 2012 in Germany, the entire contents of which are incorporated by reference herein.

FIELD

The present invention relates to transmission electron microscopy systems and methods of operating transmission electron microscopy systems.

BACKGROUND

In a transmission electron microscopy system, an electron beam is directed onto a sample, and electrons having traversed the sample are detected in an analyzing system disposed in the beam path downstream of the sample, in order to obtain information relating to properties of the sample. The electrons incident on the sample traverse the sample un-scattered or are scattered within the sample by a certain angle, and/or change the kinetic energy within the sample.

One possible way of analyzing the electrons having traversed the sample includes separating of electrons having traversed the sample substantially un-scattered from electrons scattered by a significant angle while traversing the sample. Electrons which are scattered in the sample by a significant angle are commonly referred to as dark field electrons, while electrons traversing the sample substantially un-scattered are commonly referred to as bright field electrons. An image, commonly referred to as a bright field image can be obtained from detected local intensities of bright field electrons, while an image commonly referred to as a dark field image can be obtained from detected local intensities of dark field electrons.

Dark field images are typically useful for visualizing sample structures provided by heavy elements, such as elements heavier than iron. On the other hand, bright field images are typically useful for visualizing sample structures formed of light elements, such as elements lighter than iron. However, sample structures provided by very light elements, such as elements lighter than carbon, are difficult to be visualized by bright field images since very light elements scatter electrons traversing the sample by only a very small amounts and impose only very small phase changes on electrons traversing the sample.

An analyzing method has been proposed which is referred to as "Annular Bright Field Imaging" (ABF) and in which a ring-shaped detector is used for detecting bright field electrons having traversed the sample along directions having an angle relative to the optical axis greater than a minimum angle which is different from zero.

SUMMARY

It is an object of the present invention to provide a transmission electron microscopy system configured to detect bright field electrons having traversed the sample along directions having an angle relative to the optical axis which is greater than a minimum angle greater than zero, and wherein the system provides a higher flexibility in detecting such bright field electrons.

According to some embodiments, a transmission electron microscopy system comprises an illumination system configured to direct electrons onto a location within a sample plane such that the electrons are incident at that location only from directions having an angle relative to an optical axis of the transmission electron microscopy system smaller than an outer cone angle. The outer cone angle can be, for example, within a range from 8 mrad to 15 mrad for illumination systems not comprising a corrector. In illumination systems having a corrector for compensating at least opening errors of lenses of the illumination system, the outer cone angle can be, for example, from within a range from 20 mrad to 50 mrad.

The system further comprises an objective lens system disposed in the beam path downstream of the sample plane and having an object plane coinciding with the sample plane and having a diffraction plane corresponding to the object plane. A first projection system is disposed in the beam path downstream of the objective lens system, wherein the projection system images the diffraction plane into a first intermediate diffraction plane. A second projection system is disposed in the beam path downstream of the first projection system, wherein the second projection system images the first intermediate diffraction plane into a second intermediate diffraction plane.

When the present disclosure provides definitions with respect to positions of optical planes or optical components relative to other optical planes or optical components, such definitions do not have to be exactly fulfilled in the strict geometrical sense. Due to a limited accuracy of mounting of components relative to each other, tolerances are always possible. Moreover, it is not always possible to exactly fulfill such definitions due to, for example, a physical extensions of optical elements, such that those definitions are only approximately fulfilled while still achieving technical advantages associated with the definition to a significant amount. For example, the coincidence of the object plane of the objective lens system and the sample plane mentioned above can be not exactly fulfilled in practice while still achieving the technical function of the imaging of the sample plane into an image plane in a satisfactory way. Often, a geometric definition of a position of an optical plane or an optical component relative to a further optical plane or optical component can be sufficiently precise in practice when a deviation between the actual position of the optical plane or component relative to the other optical plane or component is less than, for example, 10% of an image distance of a lens providing the object plane, the image plane or the diffraction plane, respectively.

A first aperture having a central opening is positioned in the first intermediate diffraction plane, wherein the opening is defined by a radial outer edge extending along a circle about the optical axis having a first radius. A magnification of the first projection system and the first radius of the opening are adjusted relative to each other such that dark field electrons leaving the object plane in directions having an angle relative to the optical axis greater than the outer cone angle may not traverse the first aperture. Moreover, the magnification of the first projection system and the first radius can be adjusted relative to each other such that also bright field electron can not traverse the opening of the first aperture wherein the bright field electrons traverse the object plane along directions having an angle relative to the optical axis greater than a maximum angle. Herein, the radius of the first opening defines a maximum angle relative to the optical axis for directions of trajectories of bright field electron traversing the object plane which are detectable by a bright field detector positioned in the beam path downstream of the first aperture.

According the exemplary embodiments herein, the bright field detector is disposed in the second intermediate diffraction plane and includes a detection surface defined by an inner edge extending about the optical axis along a circle having a second radius. This second radius defines a minimum angle relative to the optical axis of directions of trajectories of bright field electrons traversing the sample plane and detectable by the bright field detector. Thus, the bright field detector only detects those bright field electrons traversing the sample along trajectories oriented in directions having an angle relative to the optical axis which is greater than the minimum angle and smaller than the maximum angle.

According to an alternative exemplary embodiment herein, a second aperture is disposed in the second intermediate diffraction plane upstream of the bright field detector, wherein the second aperture has an opening defined by an outer edge extending about the optical axis along the circle having a second radius such that only those bright field electrons traversing the sample along trajectories oriented in directions having a minimum angle defined by the second radius relative to the optical axis can traverse the second aperture to be incident on the bright field detector.

Also this alternative exemplary embodiment allows to detect, using the bright field detector, those bright field electrons traversing the sample along directions having an angle relative to the optical axis which is greater than the minimum angle and smaller than the maximum angle.

According to exemplary embodiments, the magnification of the first projection system can be changed in order to change the maximum angle.

According to further exemplary embodiments, the magnification of the second projection system can be changed in order to change the minimum angle.

The system is sufficiently flexible to optimize the visualization of particular structures of the sample in the bright field image by selectively adjusting the minimum angle and/or the maximum angle. It is in particular possible to visualize sample structures provided by very light elements in the bright field image.

According to some embodiments, the changing of the magnification of the first projection system and/or the second projection system is performed such that the image distance of the respective projection system remains unchanged, such that the position of the first intermediate diffraction plane and the position of the second intermediate diffraction plane, respectively, remains unchanged when the magnification is changed.

According to particular embodiments herein, the first or second projection systems comprise at least three electron optical lenses, wherein each of the three lenses can be independently energized by a controller of the transmission electron microscopy system.

According to a further embodiment, a transmission electron microscopy system is provided which comprises: an illumination system configured to direct electrons onto a location within a sample plane such that the electrons are incident at this location only from directions having an angle relative to the optical axis which is smaller than an outer cone angle; an objective lens system having an object plane located in the sample plane and a diffraction plane corresponding to the object plane; a first projection system imaging the diffraction plane into a first intermediate diffraction plane; a second projection system imaging the first intermediate diffraction plane into a second intermediate diffraction plane; a first aperture defined by an outer edge extending along a circle having a first radius about the optical axis, wherein the first aperture is located in the first intermediate diffraction plane; and either a bright field detector located in the second intermediate diffraction plane and having a detection surface defined by an outer edge extending along a circle having a second radius about the optical axis, or a bright field detector and a fourth aperture located in the second intermediate diffraction plane and having an opening defined by an outer edge extending along a circle having a second radius about the optical axis and wherein the bright field detector is disposed in the beam path downstream of the second aperture; wherein the second radius defines a maximum angle relative to the optical axis of directions of bright field electrons traversing the sample plane and detectable by the bright field detector; and wherein the first radius defines a minimum angle relative to the optical axis of directions of bright field electrons traversing the sample plane and detectable by the bright field detector.

Also this transmission electron microscopy system allows to detect, using the bright field detector, those bright field electrons having traversed the sample in directions having an angle relative to the optical axis which is greater than a minimum angle and smaller than a maximum angle. This transmission electron microscopy system differs from the system according to the embodiment illustrated above in that the aperture located in the first intermediate diffraction plane defines the minimum angle rather than the maximum angle and in that the aperture positioned in the second intermediate diffraction plane defines the maximum angle rather than the minimum angle.

According to exemplary embodiments herein, the magnification of the first projection system can be changed in order to change the minimum angle, and/or the magnification of the second projection system can be changed in order to change the maximum angle.

According to some embodiments, the first radius can be changed in order to change the minimum angle. This can be achieved, for example, by using plural first apertures having openings with different first radii, wherein one of the plural apertures can be disposed in the beam path.

According to further exemplary embodiments, an energy filter is disposed in the beam path between the first intermediate diffraction plane and the second intermediate diffraction plane. This allows energy dependent detection of bright field electrons. According to a particular embodiment herein, an aperture having a slit-shaped opening is disposed in the beam path between the energy filter and the bright field detector, such that only bright field electrons having kinetic energies from within a limited energy range are allowed to be incident on the bright field detector.

According to further embodiments, the transmission electron microscopy system comprises a dark field detector positioned in the beam path upstream of the first aperture and configured to detect dark field electrons. According to a particular embodiment herein, the dark field detector includes the first aperture, wherein the dark field detector includes a central opening defined by an inner edge of the dark field detector, wherein the inner edge extends about the optical axis along a circle having the first radius.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

Figure 1:
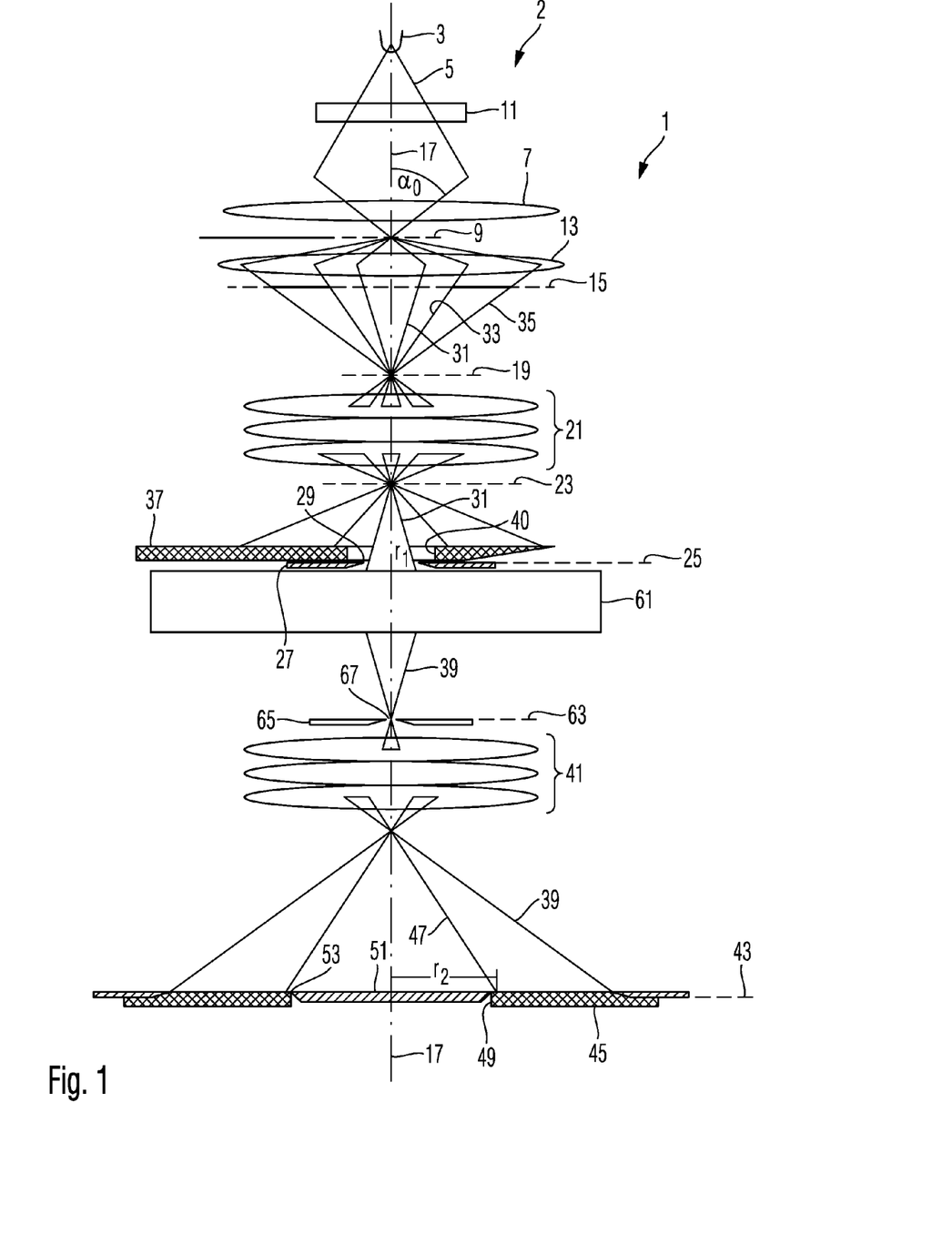
FIG. 1 is a schematic illustration of a transmission electron microscopy system according to a first embodiment.

FIG. 1 is a schematic illustration of a transmission electron microscope. The transmission electron microscope 1 comprises an illumination system 2 including an electron beam source 3 emitting an electron beam 5. The electron beam 5 is focused in a sample plane 9 by an electron lens 7 of the illumination system 2. Herein, electrons are incident on a location within the sample plane 9 from various directions. Trajectories of these electrons and their directions are located within a cone defined by an outer cone angle $\alpha_0$. In illumination systems which do not include a corrector, the outer cone angle $\alpha_0$ typically has values from within a range from 8 mrad to 15 mrad, and a diameter of the beam focus in the sample plane 9 may typically amount, in such illumination systems, to 0.2 nm to 100 nm. The illumination system 2 may, however, also include a corrector schematically indicated at 11 in FIG. 1. In illumination systems including a corrector, the outer cone angle $\alpha_0$ may typically amount to 20 mrad to 50 mrad, and a diameter of the beam focus in the sample plane 9 can be from within a range from below 0.1 nm to 100 nm.

Apart from the lens 7 and the corrector 11, further lenses and electron optical elements can be disposed in the beam path between the electron beam source 3 and the sample plane 9. In particular, a beam deflector (not shown in FIG. 1) can be disposed in this beam path in order to displace the location of incidence of the electron beam in the sample plane 9 or to scan the location of incidence across a region within the sample plane 9.

An objective lens 13 is disposed in the beam path downstream of the sample plane 9 such that an object plane of the objective lens 13 coincides with the sample plane 9. The objective lens 13 has a diffraction plane 15 corresponding to the object plane such that electrons traversing the object plane 9 at different angles relative to an optical axis 17 of the electron microscope 1 traverse the diffraction plane 15 at different locations. Moreover, electrons traversing the object plane at different locations but under same angles relative to the optical axis traverse the diffraction plane at a same location. The objective lens 13 images the object plane 9 into an intermediate image plane 19.

A first projection system 21 is disposed in the beam path downstream of the objective lens 13. The first projection system 21 images the intermediate image plane 19 into a second intermediate image plane 23, and the first projection system 21 generates an image of the diffraction plane 15 in a plane 25. In the illustrated example, the first projection system 21 comprises three electron optical lenses which can be independently energized by a controller (not shown in FIG. 1) of the transmission electron microscopy system 1 in order to change a magnification of the imaging of the diffraction plane 15 into the intermediate diffraction plane 25 without changing a position of the intermediate diffraction plane 25 along the optical axis 17.

An aperture 27 is disposed in the intermediate diffraction plane 25. The aperture 27 comprises a circular opening defined by an outer edge 29 of the opening, which is also an inner edge of the aperture plate, wherein the outer edge 29 extends along a circle having a radius $r_1$ and its center on the optical axis 17.

An outer bounding surface of a beam of electrons having traversed the sample plane without scattering, i.e. of the beam of bright field electrons, is indicated with reference numeral 31 in FIG. 1. Electrons having experienced a significant amount of scattering in the sample plane are referred to as dark field electrons. These dark field electrons are shown in FIG. 1 as a hollow cone having a circular ring-shaped beam cross section and having an inner bounding surface indicated at reference numeral 33 and an outer bounding surface indicated at reference numeral 35.

The radius $r1$ and the magnification of the first projection system 21 are adjusted such that at least the dark field electrons may not traverse the aperture 27 and such that at least a portion of the bright field electrons may traverse the aperture 27.

A dark field detector 37 can be disposed in the beam path upstream of the aperture 27 in order to detect dark field electrons. The dark field detector 37 may comprise a ring-shaped active electron sensitive surface.

For this purpose, the dark field detector 37 includes a central opening 40 which can be traversed by the bright field electrons. Due to manufacturing limitations, the active electron sensitive surface of the detector 37 does not extend, in the radially inwards direction, exactly towards the edge of the opening 40, such that the inner limiting angle 33 of detectable dark field electrons is defined by the inner edge of the active electron sensitive surface of the detector 37 rather than the diameter of the opening 40.

In the illustration of FIG. 1, the magnification of the first projection system 21 and the radius $r_1$ of the opening of the aperture 27 are selected such that those bright field electrons which traverse the sample plane 9 at an angle $\alpha_0$ relative to the optical axis may just traverse the aperture 27. It is, however, also possible to increase the magnification of the projection system 21 or to reduce the radius $r_1$ such that only those bright field electrons may traverse the aperture 27 which traverse the sample plane at an angle relative to the optical axis which is smaller than a maximum angle which, in turn, is smaller than the outer cone angle $\alpha_0$. By adjusting the radius $r_1$ relative to the magnification of the projection system 21 it is thus possible to adjust the maximum angle at which bright field electrons traversing the aperture 27 traverse the sample plane 9. An outer bounding surface of the beam of bright field electrons traversing the aperture 27 is indicated with reference numeral 39 in FIG. 1.

A second projection system 41 is disposed in the beam path downstream of the intermediate diffraction plane 25. The second projection system 41 images the first intermediate diffraction plane 25 into a second intermediate diffraction plane 43. A bright field detector 45 is disposed in the second intermediate diffraction plane 43. The bright field detector 45 is configured such that it can only detect those bright field electrons 39 which traverse the sample plane 9 at an angle relative to the optical axis which is greater than a minimum angle, such that the bright field electrons detectable by the bright field detector 45 form a beam of a hollow cone shape and having a circular ring-shaped beam cross section, wherein an inner bounding surface of this beam upstream of the bright field detector 45 is indicated with reference numeral 47 in FIG. 1. This can be achieved by a central opening of the bright field detector 45, wherein the central opening is defined by an outer edge coinciding with an inner edge 49 of the bright field detector 45, wherein the inner edge extends about the optical axis 17 along a circle having a radius $r_2$. Alternatively, this can be achieved by an aperture plate 51 disposed in the second intermediate diffraction plane 43, wherein the aperture 51 is defined by a circular outer edge 53 extending about the optical axis along a circle having the radius $r_2$. In this situation, it is not necessary that the bright field detector 45 is disposed in the second intermediate diffraction plane 43, and the bright field detector 45 can be located in the beam path downstream of the second intermediate diffraction plane 43 where the aperture 51.

As mentioned above, the bright field detector 45 may comprise a ring-shaped active electron sensitive surface. The inner radius of the electron sensitive surface determines a minimum amount of scattering which the electrons must experience in the sample in order to be detected by the bright field detector 45. Moreover, the outer radius of the ring-shaped electron sensitive surface determines a maximum amount of scattering which the electrons may experience within the sample in order to be detected by the bright field detector 45. Alternatively, it is possible to configure the bright field detector 45 such that it has a circular shape, centered at the optical axis, wherein a circular aperture covers the central portion of the bright field detector.

A magnification of the second projection system 41 can be changed without changing a position of the second intermediate diffraction plane 43 along the optical axis 17. For this purpose, the second projection system 41 may comprise three or more electron optical lenses which can be independently energized by the controller of the transmission electron microscopy system 1.

A minimum angle relative to the optical axis 17 at which bright field electrons detectable by the bright field detector 45 may traverse the sample plane 9 can be selected by adjusting the magnification of the second projection system 41 and the radius $r_2$ of the inner edge of the bright field detector 45 and of the outer edge of the aperture 51, respectively. For this purpose, plural apertures 51 having different radii $r_2$ can be provided, wherein one of the plural apertures is selectively disposed upstream of the bright field detector 45 in order to select a desired radius $r_2$.

The transmission electron microscopy system 1 allows to adjust the maximum angle relative to the optical axis of bright field electrons traversing the sample plane by adjusting the magnification of the first projection system 21 and/or the radius $r_1$. In other words, an outer bounding surface 39 of the detected bright field electron beam can be adjusted by selecting the magnification of the first projection system 21 and or/the radius $r_1$. Moreover, the minimum angle relative to the optical axis of detected bright field electrons traversing the sample can be adjusted by adjusting the magnification of the second projection system 41 and/or by adjusting the radius $r_2$. In other words, the inner bounding surface 47 of the detected bright field electron beam can be adjusted by selecting the magnification of the second projection system 41 and/or the radius $r_2$.

An energy filter 61 can be disposed in the beam path between the first intermediate diffraction plane 25 and the second intermediate diffraction plane 43 in order to provide energy resolved detection of bright field electrons. For this purpose, an aperture 65 having a slit-shaped opening is disposed in a spectral plane 63 of the energy filter 61, wherein only bright field electrons having kinetic energies from within a narrow energy range may traverse the slit-shaped opening of the aperture 65.

Figure 2:
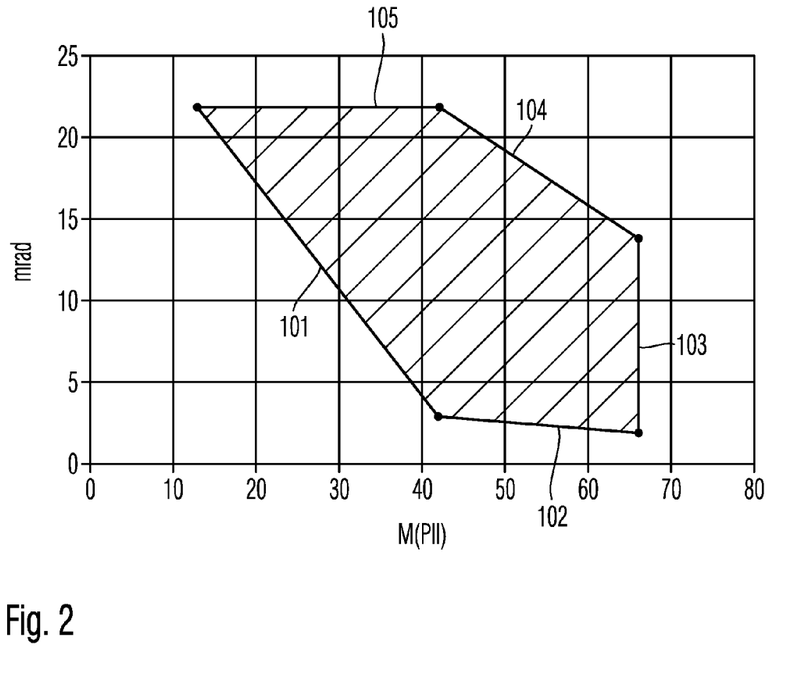
FIG. 2 is a schematic illustration of angular ranges of detectable bright field electrons in the transmission electron microscopy system of FIG. 1.

FIG. 2 is a schematic illustration of angular ranges of bright field electrons which can be detected with the transmission electron microscopy system shown in FIG. 1 according to an exemplary embodiment. In this exemplary embodiment, the opening 29 of the aperture 27 has a radius $r_1$ of 300 μm, the magnification of the first projection system 21 is set to a value of 8, and the detector 45 has a ring-shaped detection surface having an inner radius $r_2$ and an outer radius such that it detects electrons traversing the sample at angles from 51 mrad (corresponding to line 47 in FIGS. 1) to 220 mrad (corresponding to line 39 in FIG. 1). FIG. 2 shows the angles, in mrad, in the sample plane of trajectories of detectable electrons in dependence of the magnification M(PII) of the second projection system 41, wherein the detectable electrons are indicated by a hatched region defined by lines 101, 102, 103, 104 and 105.

The maximum angular range is achieved if the magnification M(PII) of the second projection system 41 is selected such that the outer bounding surface 31 of the bright field beam defined by the radius $r_1$ of the aperture 25 exactly corresponds with the outer detection angle 39 of the bright field detector 45. In the present example, this magnification amounts to M(PII)=42. At smaller magnifications (M(PII) <42) of the second magnification system, the maximum angle of the detectable bright field electrons remains determined by the radius $r_1$ of the opening 29 of the aperture 27 and is represented by line 105 in FIG. 2. Since the radius $r_1$ is constant, the maximum angle is not affected by the magnification M(PII) of the second projection system 41. The maximum angle relative to the optical axis amounts to about 22 mrad in the illustrated example. The minimum angle of the detectable bright field electrons is defined by the inner edge of the ring-shaped detector having the radius $r_2$. While this radius is constant, the angles at which the bright field electrons traversing the sample are incident on the inner edge of the detector 45 increase with decreasing magnification M(PII) corresponding to line 101 in FIG. 2.

At magnifications of the second projection system 41 in which M(PII)>42, the maximum angle of detectable bright field electrons is determined by the outer radius of the detector 45. The angle of bright field electrons traversing the sample and incident on the outer edge of the detector 45 decreases with increasing magnification of the second projection system 41 according to line 104 in FIG. 2. At the same time, the inner angle 47 of the detectable bright field electrons changes as shown by line 102 in FIG. 2.

The line 103 in FIG. 2 represents the maximum magnification M(PII) of the illustrated exemplary transmission microscopy system. At magnifications M(PII) which are smaller than the magnification at the intersection of lines 101 and 105, the magnification of the second projection system 41 is so small that all bright field electrons traverse the plane 43 of the detector 45 within the circle having the radius $r_2$ such that they are not detectable.

Other angular ranges of detectable bright field electrons can be achieved, for example, by changing the radius $r_1$ of the opening 29 of the aperture 27, for example, the radius $r_1$ can be changed to have values of 200 μm or 400 μm. Also, the magnification of the first projection system 21 can be changed, for example such that the magnification is five times or sixteen times.

Figure 3:
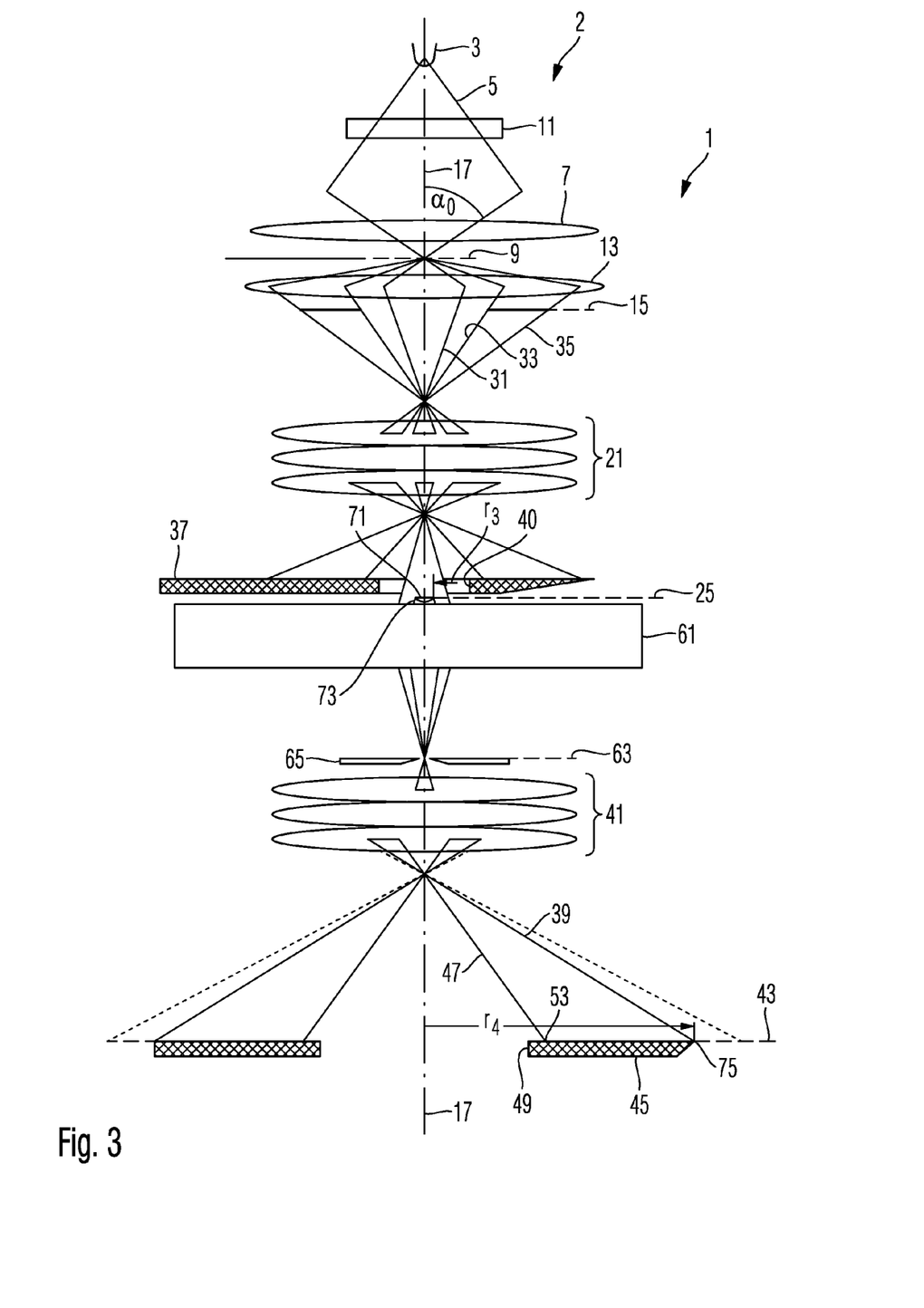
FIG. 3 is a schematic illustration of a transmission electron microscopy system according to a second embodiment.

FIG. 3 is a schematic illustration of a further embodiment of a transmission electron microscopy system. The transmission electron microscopy system shown in FIG. 3 has a configuration similar to the system illustrated with reference to FIG. 1. The system shown in FIG. 3 differs from the system illustrated with reference to FIG. 1 mainly in the manner how the minimum angle and the maximum angle relative to the optical axis of bright field electrons traversing the sample plane 9 and detected by a bright field detector 45 are adjusted. The minimum angle of these bright field electrons and, accordingly, an inner bounding surface 47 of the detected bright field electron beam is defined by an aperture 71 located in a first intermediate diffraction plane 25. The intermediate diffraction plane 25 is an image of a diffraction plane 15 of an objective lens 13 of the transmission electron microscopy system 1, wherein the image is generated by a first projection system 21. The aperture 71 has a circular shape and an outer edge 73 extending about an optical axis 17 of the microscopy system 1 along a circle having a radius $r_3$. The aperture 71 absorbs bright field electrons traversing the sample plane 9 at angles which are smaller than a minimum angle. The minimum angle can be adjusted by changing the magnification of the first projection system 21 and or by changing the radius $r_3$ of the aperture 71.

The aperture 71 disposed in the first intermediate diffraction plane 25 has a central region, centered relative to the optical axis, which does not allow electrons to traverse the aperture. Outside of the central region, the electrons may traverse the aperture, however. Alternatively, the aperture 71 may include a ring-shaped opening having a central portion, centered relative to the optical axis, which does not allow electrons to traverse, a ring-shaped portion surrounding this central portion which allows electrons to traverse, and a peripheral portion surrounding the ring-shaped portion which does not allow electrons to traverse the aperture. The magnification of the first projection system can be adjusted in dependence of the set outer cone angle $\alpha_0$ of the illumination system and in dependence of the outer radius of the ring-shaped region allowing electrons to traverse such that dark field electrons may not traverse the aperture since they are incident on the peripheral portion which does not allow electrons to traverse.

The maximum angle of bright field electrons traversing the sample plane 9 and detectable by the bright field detector 45 is defined by an outer edge 75 of the bright field detector 45, wherein the outer edge 75 extends about the optical axis 17 along a circle having a radius $r_4$. Alternatively, the bright field detector 45 may have a greater extension in the second diffraction plane 43 if the bright field detector 45 is disposed downstream of an aperture disposed in the second diffraction plane 43 and having a circular opening extending about the optical axis 17 along a circle having the radius $r_4$.

The second intermediate diffraction plane 43 is generated by imaging the first intermediate diffraction plane 25 using a second projection system 41. The radius $r_4$ defines the maximum angle of detected bright field electrons traversing the sample plane 9. This maximum angle can be adjusted by changing the radius $r_4$ and/or by changing the magnification of the second projection system 41.

The transmission electron microscopy system illustrated with reference to FIGS. 1 and 3 above are operated in a scanning mode of operation (scanning transmission electron microscope, STEM). In such scanning mode of operation, a focused illumination beam is scanned across the sample plane, and electrons having traversed with the sample are detected. It is not necessary that the detection itself is position dependent since position information relating to the sample can be derived from the actual scanned positions of the illumination beam. The illustrated transmission electron microscopes can be, however, also operated according to the normal TEM mode, in which an extended region of the object is simultaneously illuminated with electrons and wherein the extended region is imaged, using the first and second projection systems 21, 41 onto a position resolving detector, such as a CCD camera sensitive to electrons. For such modification, the dark field detector 37 and the aperture 27 can remain in place since the openings of the dark field detector and the aperture 27 are sufficiently large such that they do not limit the image size. However, it can be still advantageous to mount one or more of the dark field detectors 37, the aperture 27, the bright field detector 45 and the aperture 51 using manipulators which can remove these components from the beam path without breaking the vacuum of the electron beam column in order to operate the system according to the TEM mode. Similarly, one or more of the apertures 71, the dark field detector 37 and the ring-shaped detector 45 of the system shown in FIG. 3 can be mounted on manipulators in order to remove those components from the beam path.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A transmission electron microscopy system having an optical axis, wherein the transmission electron microscopy system comprises:
    an illumination system configured to direct electrons onto a location within a sample plane such that the electrons are incident at this location only from directions having an angle relative to the optical axis which is smaller than an outer cone angle;
    an objective lens system having an object plane located in the sample plane and a diffraction plane corresponding to the object plane;
    a first projection system imaging the diffraction plane into a first intermediate diffraction plane;
    a second projection system imaging the first intermediate diffraction plane into a second intermediate diffraction plane;
    a first aperture having a central opening, wherein the central opening is defined by an outer edge extending along a circle having a first radius about the optical axis, wherein the first aperture is located in the first intermediate diffraction plane; and
    either a bright field detector located in the second intermediate diffraction plane and having a detection surface defined by an inner edge extending along a circle having a second radius about the optical axis, or a bright field detector and a second aperture located in the second intermediate diffraction plane and having an opening defined by an outer edge extending along a circle having a second radius about the optical axis and wherein the bright field detector is disposed in the beam path downstream of the second aperture;
    wherein the first radius defines a maximum angle relative to the optical axis of directions of bright field electrons traversing the sample plane and detectable by the bright field detector; and
    wherein the second radius defines a minimum angle relative to the optical axis of directions of bright field electrons traversing the sample plane and detectable by the bright field detector.

2. The transmission electron microscopy system according to claim 1, wherein a magnification of the first projection system and the first radius are configured such that dark field electrons leaving the object plane in directions having an angle relative to the optical axis greater than the outer cone angle do not traverse the opening of the first aperture.

3. The transmission electron microcopy system according to claim 1, further comprising a controller configured to change at least one of a magnification of the first projection system and a magnification of the second projection system in order to define a maximum scattering angle and a minimum scattering angle, respectively, of bright field electrons traversing the sample plane and detectable by the bright field detector.

4. The transmission electron microcopy system according to claim 1, wherein the first radius of the opening of the first aperture is changeable or wherein the system comprises plural first apertures having openings of different radii, wherein one of the plural apertures is selectively disposable in the beam path.

5. The transmission electron microcopy system according to claim 1, further comprising an energy filter disposed in the beam path between the first projection system and the second projection system.

6. The transmission electron microcopy system according to claim 5, wherein the energy filter is disposed in the beam path downstream of the first aperture.

7. The transmission electron microcopy system according to claim 1, further comprising a dark field detector disposed in the beam path upstream of the first aperture configured to detect dark field electrons.

8. The transmission electron microcopy system according to claim 7, wherein the dark field detector includes the first aperture.

9. The transmission electron microcopy system according to claim 1, wherein the outer cone angle has a value of at least one of greater than 8 mrad, greater than 15 mrad, greater than 25 mrad, greater than 35 mrad and greater than 45 mrad.

10. The transmission electron microcopy system according to claim 1, wherein a maximum angle relative to the optical axis of directions of bright field electrons traversing the sample plane and detectable by the bright field detector is at least one of equal to the outer cone angle, less than 0.9 times the outer cone angle, less than 0.8 times the outer cone angle and less than 0.7 times the outer cone angle.

11. The transmission electron microcopy system according to claim 1, wherein a minimum angle relative to the optical axis of directions of bright field electrons traversing the sample plane and detectable by the bright field detector is at least one of greater than 0.2 times the outer cone angle, greater than 0.3 times the outer cone angle, greater than 0.4 times the outer cone angle and greater than 0.5 times the outer cone angle.

12. The transmission electron microcopy system according to claim 1, wherein the illumination system comprises a corrector configured to correct at least an opening error of the illumination system.

13. A transmission electron microscopy system having an optical axis, wherein the transmission electron microscopy system comprises:
an illumination system configured to direct electrons onto a location within a sample plane such that the electrons are incident at this location only from directions having an angle relative to the optical axis which is smaller than an outer cone angle;
an objective lens system having an object plane located in the sample plane and a diffraction plane corresponding to the object plane;
a first projection system imaging the diffraction plane into a first intermediate diffraction plane;
a second projection system imaging the first intermediate diffraction plane into a second intermediate diffraction plane;
a first aperture defined by an outer edge extending along a circle having a first radius about the optical axis, wherein the first aperture is located in the first intermediate diffraction plane; and
either a bright field detector located in the second intermediate diffraction plane and having a detection surface defined by an outer edge extending along a circle having a second radius about the optical axis, or a bright field detector and a fourth aperture located in the second intermediate diffraction plane and having an opening defined by an outer edge extending along a circle having a second radius about the optical axis and wherein the bright field detector is disposed in the beam path downstream of the second aperture;
wherein the second radius defines a maximum angle relative to the optical axis of directions of bright field electrons traversing the sample plane and detectable by the bright field detector; and
wherein the first radius defines a minimum angle relative to the optical axis of directions of bright field electrons traversing the sample plane and detectable by the bright field detector.

14. The transmission electron microcopy system according to claim 13, further comprising a controller configured to change at least one of a magnification of the first projection system and a magnification of the second projection system in order to define a maximum scattering angle and a minimum scattering angle, respectively, of bright field electrons traversing the sample plane and detectable by the bright field detector.

15. The transmission electron microcopy system according to claim 13, wherein the first radius of the first aperture is changeable or wherein the system comprises plural first apertures having different radii, wherein one of the plural apertures is selectively disposable in the beam path.

16. The transmission electron microcopy system according to claim 13, further comprising an energy filter disposed in the beam path between the first projection system and the second projection system.

17. The transmission electron microcopy system according to claim 16, wherein the energy filter is disposed in the beam path downstream of the first aperture.

18. The transmission electron microcopy system according to claim 13, further comprising a dark field detector disposed in the beam path upstream of the first aperture configured to detect dark field electrons.

19. The transmission electron microcopy system according to claim 13, wherein the outer cone angle has a value of at least one of greater than 8 mrad, greater than 15 mrad, greater than 25 mrad, greater than 35 mrad and greater than 45 mrad.

20. The transmission electron microcopy system according to claim 13, wherein a maximum angle relative to the optical axis of directions of bright field electrons traversing the sample plane and detectable by the bright field detector is at least one of equal to the outer cone angle, less than 0.9 times the outer cone angle, less than 0.8 times the outer cone angle and less than 0.7 times the outer cone angle.

21. The transmission electron microcopy system according to claim 13, wherein a minimum angle relative to the optical axis of directions of bright field electrons traversing the sample plane and detectable by the bright field detector is at least one of greater than 0.2 times the outer cone angle, greater than 0.3 times the outer cone angle, greater than 0.4 times the outer cone angle and greater than 0.5 times the outer cone angle.

22. The transmission electron microcopy system according to claim 13, wherein the illumination system comprises a corrector configured to correct at least an opening error of the illumination system.

23. A method of operating a transmission electron microscopy system, wherein the method comprises:
- directing of electrons onto a location within a sample plane such that the electrons are incident on this location only from directions having an angle relative to an optical axis less than an outer cone angle;
- imaging of a diffraction plane of an objective lens system into a first intermediate diffraction plane using a first projection system;
- adjusting a magnification of the first projection system relative to a first radius of an opening of an aperture disposed in the first intermediate diffraction plane such that dark field electrons leaving the sample plane in directions having an angle relative to the optical axis greater than the outer cone angle can not traverse the first aperture.

* * * * *